(12) United States Patent
Take (10) Patent No.: US 7,093,647 B2
(45) Date of Patent: Aug. 22, 2006

(54) EBULLITION COOLING DEVICE FOR HEAT GENERATING COMPONENT

(75) Inventor: Koichiro Take, Oyama (JP)

(73) Assignee: Showa Denko K.K., Tokyo (JP)

( * ) Notice: Subject to any disclaimer, the term of this patent is extended or adjusted under 35 U.S.C. 154(b) by 52 days.

(21) Appl. No.: 10/499,647

(22) PCT Filed: Dec. 26, 2002

(86) PCT No.: PCT/JP02/13571

§ 371 (c)(1),
(2), (4) Date: Jun. 28, 2004

(87) PCT Pub. No.: WO03/056626

PCT Pub. Date: Jul. 10, 2003

(65) Prior Publication Data

US 2005/0205239 A1  Sep. 22, 2005

Related U.S. Application Data

(60) Provisional application No. 60/356,121, filed on Feb. 14, 2002.

(30) Foreign Application Priority Data

Dec. 27, 2001  (JP) .............................. 2001-397783

(51) Int. Cl.
*F28D 15/02*  (2006.01)

(52) U.S. Cl. .............................. 165/80.3; 165/104.21; 165/104.26

(58) Field of Classification Search ................ 165/80.3, 165/185, 128–130, 104.11, 104.21, 104.26, 165/104.33
See application file for complete search history.

(56) References Cited

U.S. PATENT DOCUMENTS

| 3,986,550 | A |   | 10/1976 | Mitsuoka |
| 4,254,821 | A |   | 3/1981  | Matsuda et al. |
| 4,554,966 | A |   | 11/1985 | Vasiliev et al. |
| 4,663,243 | A | * | 5/1987  | Czikk et al. ................. 428/559 |
| 5,823,248 | A | * | 10/1998 | Kadota et al. ......... 165/104.33 |
| 6,019,165 | A | * | 2/2000  | Batchelder .................. 165/80.3 |
| 6,279,649 | B1 |  | 8/2001  | Osakabe |

FOREIGN PATENT DOCUMENTS

| FR | 1 028 617    |   | 5/1953 |            |
| FR | 2 446 455    |   | 8/1980 |            |
| GB | 2 040 033 A  |   | 8/1980 |            |
| JP | 2-146498     | * | 6/1990 | ............ 165/104.26 |
| JP | 03-074300    |   | 3/1991 |            |

(Continued)

*Primary Examiner*—Teresa J. Walberg
(74) *Attorney, Agent, or Firm*—Oblon, Spivak, McClelland, Maier & Neustadt, P.C.

(57) ABSTRACT

The invention provides an ebullition cooling device 1 for a heat generating component B which device comprises a boiling unit 2 for boiling a refrigerant A contained therein with the heat generated by the heat generating component B as attached to an outer surface of the unit, a condensing unit 3 disposed above the boiling unit 2 for condensing a refrigerant vapor A1 flowing thereinto from the boiling unit 2 by heat exchange with an external fluid C, and a communication pipe 4 interconnecting the units 2, 3 and having a refrigerant vapor channel 41 and a refrigerant condensate channel 42 therein. The cooling device 1 can be designed with greater freedom, and is therefore fully useful for electronic devices which are compacted or higher in complexity, smaller in the amount of refrigerant to be enclosed therein and outstanding in heat dissipating performance.

12 Claims, 4 Drawing Sheets

FOREIGN PATENT DOCUMENTS

| | | |
|---|---|---|
| JP | 8-035786 | 2/1996 |
| JP | 9-167818 | 6/1997 |
| JP | 10-144831 | 5/1998 |
| JP | 2-263097 | * 10/1999 ............ 165/104.21 |
| WO | 97/14925 | 4/1997 |
| WO | 00/70289 | 11/2000 |

* cited by examiner

EBULLITION COOLING DEVICE FOR HEAT GENERATING COMPONENT

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/356,121 filed Feb. 14, 2002 pursuant to 35 U.S.C. §111(b).

TECHNICAL FIELD

The present invention relates to ebullition cooling devices for use in cooling heat generating components, such as diodes and transistors, incorporated in electronic devices or the like.

BACKGROUND ART

Ebullition cooling devices are adapted to cool heat generating components by heat transport due to the boiling and condensation of refrigerant, and are used in various electronic devices for cooling heat generating components, such as diodes and transistors, incorporated in the device.

Refrigerants of low boiling point for use in ebullition cooling devices are generally fluorocarbons and like expensive refrigerants. Preferably, therefore, ebullition cooling devices have such a construction that the amount of refrigerant to be enclosed therein can be smaller to the greatest possible extent.

Ebullition cooling devices already known for use with heat generating components include the device disclosed, for example, in JP-A No. 8-204075(1996). The disclosed device comprises a boiling unit in the form of a hollow planar plate having a multiplicity of hollow channels in its interior and a side wall outer surface with a heat generating component attached thereto, and a condensing unit in the form of a heat exchanger having plate fins. The hollow planar plate constituting the boiling unit is connected directly to the heat exchanger constituting the condensing unit so as to hold the hollow channels of the former in communication with a header tank of the latter.

The cooling device described above has the boiling unit provided by a hollow planar plate, so that the amount of refrigerant enclosed need not be very great, whereas the arrangement wherein the hollow planar plate is connected directly to the heat exchanger results in a low degree of freedom in designing the device. Accordingly, the device is not fully useful for electronic devices which are compacted or higher in complexity and can not always be installed within such electronic devices.

When the heat receiving position (e.g., the location where a heat generating component is installed) of an electronic device is a large distance away from the heat dissipating position thereof (e.g., the location where a vent is provided), the ebullition cooling device described must be made usable in the electronic device, for example, by giving an increased size to the hollow planar plate. This entails a corresponding increase in the amount of refrigerant enclosed.

Further with the ebullition cooling device described, the heat generating component is attached to the side wall outer surface of the hollow planar plate which has a relatively small thickness, so that increased contact thermal resistance between the plate and the component due to insufficient rigidity of the side wall is likely to result in lower heat dissipating performance.

The above device further has the problem that the refrigerant vapor flowing upward from the boiling unit toward the condensing unit and the refrigerant condensate flowing down from the condensing unit toward the boiling unit interfere with each other at the connection between the two units, i.e., the problem of so-called flooding. This flooding phenomenon degrades the spontaneous circulation of the refrigerant, reducing the maximum amount of heat transport and entailing lower heat dissipating performance, and therefore needs to be prevent to the greatest possible extent.

An object of the present invention is to provide an ebullition cooling device for a heat generating component which device can be designed with increased freedom so as to be fully useful in compacted or complex electronic devices or the like and is reduced in the amount of refrigerant to be enclosed therein and outstanding in heat dissipating performance.

DISCLOSURE OF THE INVENTION

The present invention provides a first ebullition cooling device for a heat generating component which device comprises a boiling unit for boiling a refrigerant contained therein with the heat generated by the heat generating component as attached to an outer surface of the unit, a condensing unit disposed above the boiling unit for condensing a refrigerant vapor flowing thereinto from the boiling unit by heat exchange with an external fluid, and a communication pipe interconnecting the boiling unit and the condensing unit and having a refrigerant vapor channel and a refrigerant condensate channel therein.

The communication pipe is thus provided between the boiling unit and the condensing unit. For example, even if the heat receiving position in the electronic device is a large distance away from the heat dissipating position of the device, or even in the case where the space between these two positions is greatly limited, the cooling device is then easily made usable in such an electronic device by adjusting the length of the communication pipe or the position where the pipe is to be installed, hence a high degree of freedom of design. The communication pipe has a refrigerant vapor channel and a refrigerant condensate channel therein, and there is no, interference between the refrigerant vapor and the refrigerant condensate within the communication pipe, so that the maximum amount of heat transport remains undecreased to ensure high heat dissipating performance. Further even when the heat receiving position is at a large distance from the heat dissipating position, an increase in the amount of refrigerant to be enclosed can be prevented by minimizing the required height of the boiling unit and increasing the length of the communication pipe.

Although the cooling device is useful when having at least one communication pipe, at least two communication pipes may be used. In the case where the cooling device has at least two communication pipes, the refrigerant vapor and the refrigerant condensate are passed through the respective pipes for each pipe to pass the vapor or condensate at a lower flow rate to corresponding reduce the resistance to the flow of the vapor or condensate and achieve improved heat dissipation performance. Further in the case where the cooling device has at least two communication pipes, the refrigerant vapor can be delivered to the condensing unit more smoothly, permitting the refrigerant vapor to flow through the condensing unit uniformly.

To prevent an increase in the amount of refrigerant to be enclosed in the device, it is desirable that the sum of the cross sectional area of the refrigerant vapor channel and that of the refrigerant condensate channel of all the communication pipes be made smaller than the horizontal cross sectional area of the interior of the boiling unit.

In the first ebullition cooling device of the invention, it is desired that the communication pipe comprise a pipe internally divided into two channels of different cross sectional areas by a partition wall extending longitudinally of the pipe, the channel of greater cross sectional area in the pipe serving as the refrigerant vapor channel, the channel of smaller cross sectional area in the pipe serving as the refrigerant condensate channel.

The pipe for constituting the communication pipe can be, for example, an extruded tube or electric resistance welded tube of aluminum or copper, and is therefore easy to make. Since the channel of greater cross sectional area in the pipe serves as the refrigerant vapor channel, and the channel of smaller cross sectional area in the pipe as the refrigerant condensate channel, reduced resistance is offered to the flow of the refrigerant vapor or condensate through each channel, permitting the fluid to flow smoothly through the channel.

In order to avoid interference in the first heat generating component ebullition cooling device of the invention between the refrigerant vapor flowing out of an upper-end outlet of the refrigerant vapor channel into a bottom portion of the condensing unit and a refrigerant condensate flowing out of the bottom portion of the condensing unit into an upper-end inlet of the refrigerant condensate channel, the communication pipe preferably has an upper end portion projecting into the condensing unit bottom portion and partially cut out so that the upper-end outlet of the refrigerant vapor channel is positioned above the upper-end inlet of the refrigerant condensate channel.

This construction effectively obviates the interference between the refrigerant vapor flowing out of the upper-end outlet of the vapor channel into the condensing unit bottom portion and the refrigerant condensate flowing out of the bottom portion into the upper-end inlet of the condensate channel, enabling the cooling device to exhibit still improved heat dissipating performance.

The present invention further provides a second ebullition cooling device for a heat generating component which device comprises a boiling unit for boiling a refrigerant contained therein with the heat generated by the heat generating component as attached to an outer surface of the unit, a condensing unit disposed above the boiling unit for condensing a refrigerant vapor flowing thereinto from the boiling unit by heat exchange with an external fluid, and a communication pipe interconnecting the boiling unit and the condensing unit and provided in an inner peripheral surface thereof with a plurality of grooves extending longitudinally of the pipe and so sized as to permit a refrigerant condensate to flow down the grooves under the action of surface tension, the communication pipe permitting the refrigerant vapor to flow through an inside portion thereof inwardly of the grooves.

For example, even if the heat receiving position in the electronic device is a large distance away from the heat dissipating position of the device, or even in the case where the space between these two positions is greatly limited, the ebullition cooling device described is then easily made usable in such an electronic device by adjusting the length of the communication pipe or the position where the pipe is to be installed, hence a high degree of freedom of design. The pipe for constituting the communication pipe can be an extruded tube or electric resistance welded tube of aluminum or copper, and is therefore easy to make. The refrigerant condensate flows down the grooves under the action of surface tension, while the refrigerant vapor flows through an inside portion of the pipe inwardly of the grooves, i.e., through the pipe central portion of large cross sectional area and reduced flow resistance. This assures smooth circulation of the refrigerant to effectively obviate the flooding phenomenon. Further even when the heat receiving position is at a large distance from the heat dissipating position, an increase in the amount of refrigerant to be enclosed can be prevented by minimizing the required height of the boiling unit and increasing the length of the communication pipe.

Although the second cooling device is also useful when having at least one communication pipe, at least two communication pipes may be used. When the cooling device has at least two communication pipes, the same advantages as in the case of the first cooling device are available.

Further with the second ebullition cooling device, it is also desirable that the sum of cross sectional areas of the channels in all the communication pipes be smaller than the horizontal cross sectional area of the boiling unit in order to prevent an increase in the amount of refrigerant to be enclosed.

The present invention provides a third ebullition cooling device for a heat generating component which device comprises a boiling unit for boiling a refrigerant contained therein with the heat generated by the heat generating component as attached to an outer surface of the unit, a condensing unit disposed above the boiling unit for condensing a refrigerant vapor flowing thereinto from the boiling unit by heat exchange with an external fluid, and a first and a second communication pipe interconnecting the boiling unit and the condensing unit, the first communication pipe having a refrigerant vapor channel therein, the second communication pipe having a refrigerant condensate channel therein.

Thus, the first and second communication pipes are provided between the boiling unit and the condensing unit. For example, even if the heat receiving position in the electronic device is a large distance away from the heat dissipating position of the device, or even in the case where the space between these two positions is greatly limited, the cooling device described is then easily made usable in such an electronic device by adjusting the length of the communication pipes or the position where the pipes are to be installed, hence a high degree of freedom of design. The refrigerant vapor flows through the vapor channel within the first communication channel, while the refrigerant condensate flows through the condensate channel within the second communication channel. This eliminates the interference between the vapor and the condensate, and diminishes the resistance to the flows of the vapor and the condensate, consequently ensuring high heat dissipation performance. Further even when the heat receiving position is at a large distance from the heat dissipating position, an increase in the amount of refrigerant to be enclosed can be prevented by minimizing the required height of the boiling unit and increasing the length of the communication pipes.

Further with the third ebullition cooling device, it is also desirable to prevent the increase in the amount of refrigerant to be enclosed by making the sum of cross sectional areas of the channels in all the communication pipes smaller than the horizontal cross sectional area of the boiling unit.

In the third ebullition cooling device of the invention, it is desirable that two kinds of pipes be different in interior cross sectional area, one of the pipes of greater interior cross sectional area providing the first communication pipe and having an interior serving as the refrigerant vapor channel, the other pipe of smaller interior cross sectional area providing the second communication pipe and having an interior serving as the refrigerant condensate channel.

The two kinds of pipes providing the first and second communication pipes can each be, for example, an extruded pipe or electric resistance welded pipes of aluminum or copper, and are very easy to make. The pipe of greater cross sectional area has an interior serving as the refrigerant vapor channel, and the pipe of smaller cross sectional area has an interior serving as the refrigerant condensate channel. Accordingly, the resistance to the flow of the vapor or condensate through each pipe is small, permitting the fluid to flow through the pipe smoothly.

With the first to third ebullition cooling devices of the invention, the boiling unit is preferably provided on an inner surface portion thereof opposed to the heat generating component with fine surface irregularities for promoting boiling and heat transfer. Such fine surface irregularities are formed, for example, by applying a powder to the inner surface portion of the boiling unit opposed to the heat generating component by brazing or thermal spraying, or by sintering or machining the inner surface portion.

The fine surface irregularities formed on the boiling unit inner surface portion opposed to the heat generating component, i.e., on the boiling heat transfer surface, afford an increased heat transfer area, effect promoted removal of nucleating bubbles and consequently result in promoted boiling and heat transfer for the cooling device to exhibit greatly improved heat dissipating performance.

With the first to third ebullition cooling devices of the invention, the heat generating component may be attached to a lower surface of a bottom portion of the boiling unit.

Since the upper surface of the boiling unit bottom portion serves as the boiling heat transfer surface in this case, the amount of refrigerant to be enclosed can be minimized. Incidentally, the heat generating component need not always be attached to the lower surface of the boiling unit bottom portion but may be attached to other portion, e.g., to the outer side surface of the boiling unit.

With the first to third ebullition cooling devices of the invention, the boiling unit comprises, for example, a peripheral wall of circular or rectangular or square cross section, a bottom wall closing a lower-end opening of the peripheral wall and a top wall closing an upper-end opening of the peripheral wall. The lower end of the communication pipe or the lower ends of the first and second communication pipes are joined usually to an upper end portion of the top wall.

In the case of the ebullition cooling device of the invention for heat generating components, the amount of refrigerant to be enclosed can be reduced without making the boiling unit thin. The side wall of the boiling unit can therefore be given an increased thickness. This obviates the likelihood that even if the heat generating component is attached to the side wall outer surface, increased contact thermal resistance between the side wall and the component due to insufficient rigidity of the side wall will result in lower heat dissipating performance.

In the first to third ebullition cooling devices of the invention, the condensing unit comprises an upper and a lower header tank arranged horizontally at a spacing, a plurality of heat exchanger tubes arranged in parallel laterally and each having a lower end joined to the lower header tank and an upper end joined to the upper header tank, and heat radiating fins fixedly arranged between the adjacent heat exchange tubes and on the outer sides of heat exchange tubes at left and right ends. The upper end of the communication pipe or the upper ends of the first and second communication pipes are joined usually to a bottom portion of the lower header tank.

Alternatively, the condensing unit may comprise a header tank disposed horizontally, a plurality of heat exchanger tubes arranged in parallel laterally and each having a lower end joined to the header tank and a closed upper end, and heat radiating fins fixedly arranged between the adjacent heat exchange tubes and on the outer sides of heat exchange tubes at left and right ends. The upper end of the communication pipe or the upper ends of the first and second communication pipes are joined usually to a bottom portion of the header tank.

The condensing unit may further comprise a cooling fan attached to one of front and rear sides of the heat exchange tubes directly or by a duct. An air stream then produced by the fan efficiently dissipates heat from the surfaces of the heat exchange tubes and the radiating fins.

BEST MODE OF CARRYING OUT THE INVENTION

FIGS. 1 to 4 show a first embodiment of the invention, i.e., an ebullition cooling device 1 for a heat generating component. The illustrated cooling device 1 comprises a boiling unit 2 for boiling a refrigerant A contained therein with the heat generated by a heat generating component B attached to an outer surface of the unit, a condensing unit 3 for condensing a refrigerant vapor A1 flowing thereinto from the boiling unit 2 by heat exchange with an external fluid C, and a communication pipe 4 interconnecting the units 2 and 3 and having a refrigerant vapor channel 41 and a refrigerant condensate channel 42 therein. The sum of the cross sectional area of the vapor channel 41 and that of the condensate channel 42 is smaller than the horizontal cross sectional area of the interior of the boiling unit 2.

Figure 1:
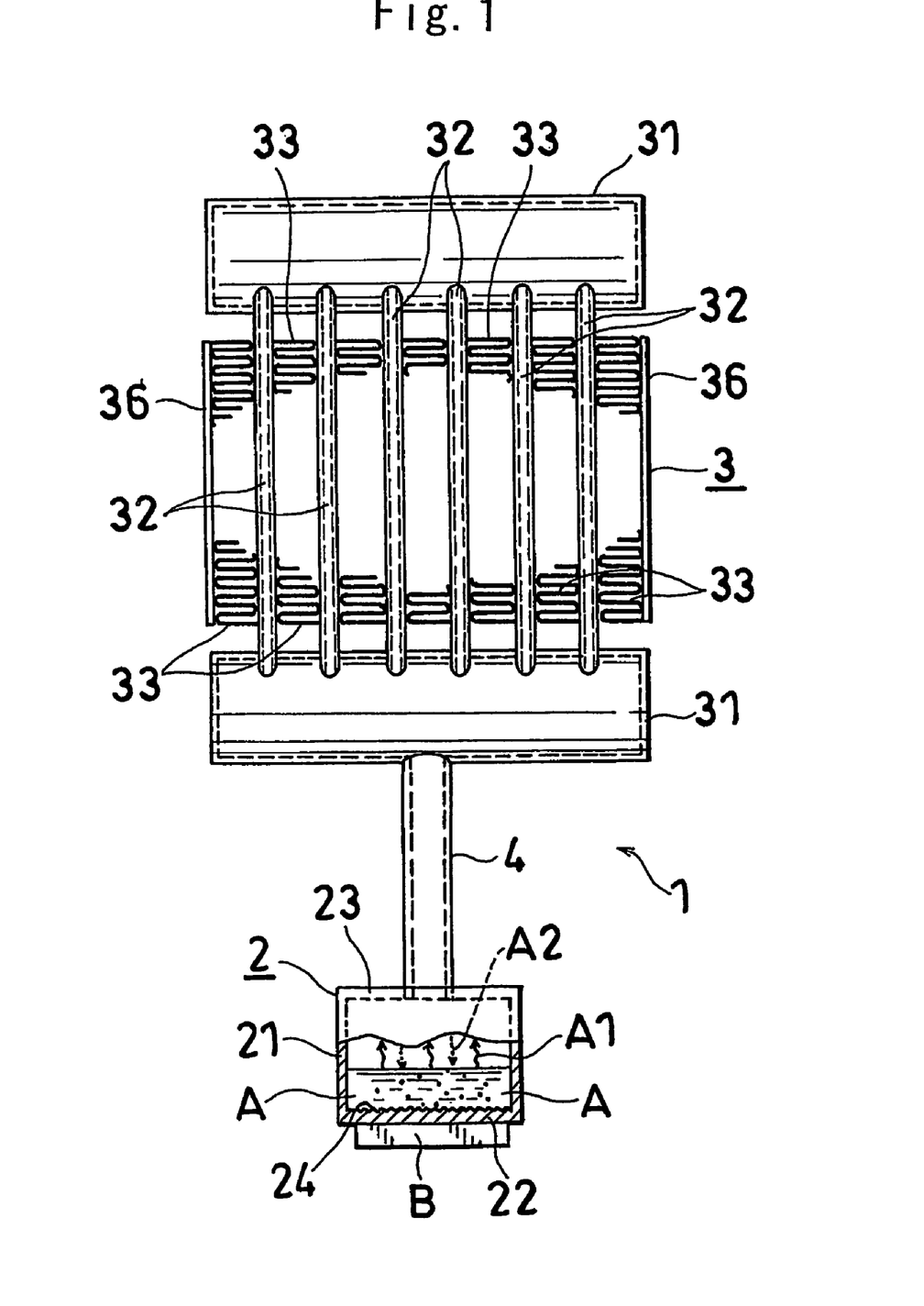
FIG. 1 is a front view partly broken away and showing a first embodiment of the invention, i.e., an ebullition cooling device for a heat generating component.
Figure 2:
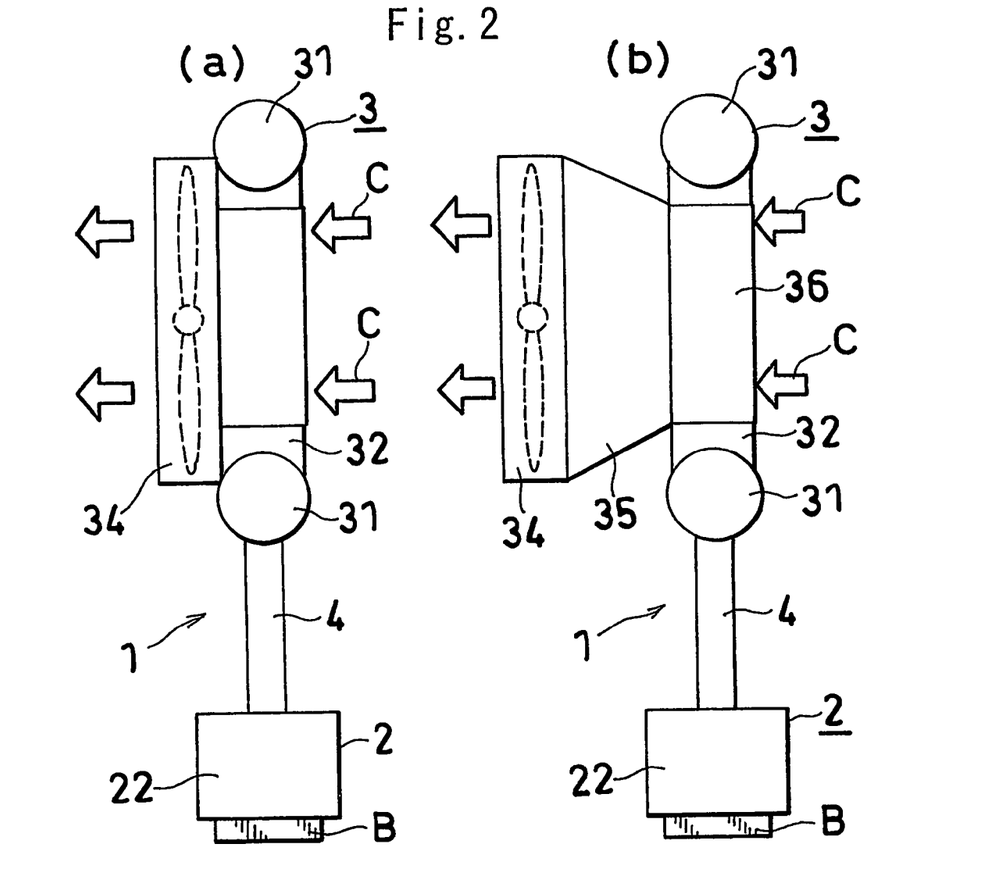
FIG. 2 includes side elevations of the ebullition cooling device, (a) showing a cooling fan as attached directly to heat exchange tubes, (b) showing the cooling fan as attached to the heat exchange tubes by a duct.
Figure 3:
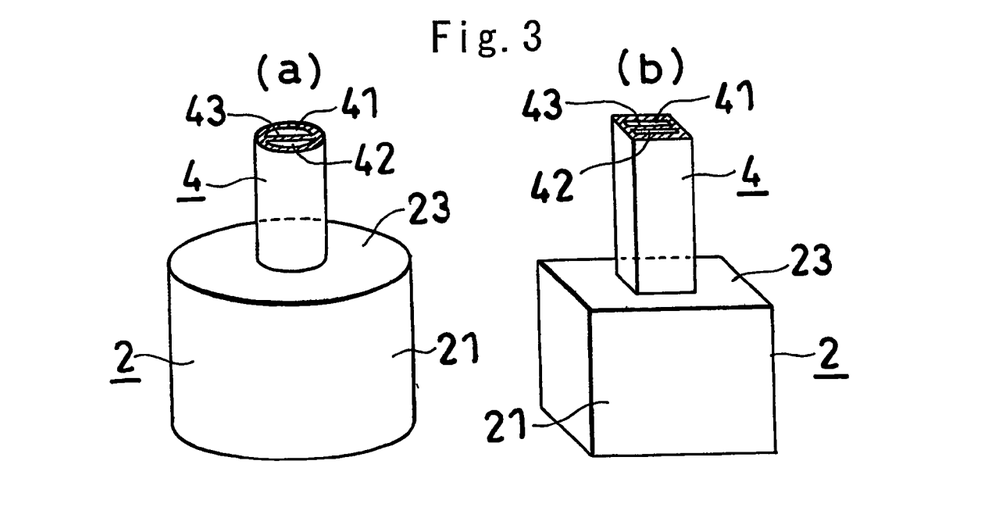
FIG. 3 includes perspective views each showing a boiling unit and part of a communication pipe on an enlarged scale, (a), (b) showing these components of different shapes.

With reference to FIGS. 1 to 3, the boiling unit 2 comprises a peripheral wall 21, a bottom wall 22 closing a lower-end opening of the peripheral wall 21 and a top wall 23 closing an upper-end opening of the wall 21. The walls 21, 22 and 23 constituting the unit 2 are made of a metal material such as aluminum or copper. The peripheral wall 21 may be circular in cross section as shown in FIG. 3(a), or rectangular or square in cross section as seen in FIG. 3(b). The peripheral wall 21 is made, for example, by machining a block material or prepared from an extrudate. When the block material is used for machining, the bottom wall 22 or the top wall 23 is usually formed integrally with the peripheral wall 21. The bottom wall 22 and the top wall 23 are made, for example, from a plate material or extrudate and joined respectively to the lower and upper ends of the peripheral wall 21 as by welding or brazing.

The boiling unit 2 has contained therein a fluorocarbon refrigerant A (see FIG. 1). The refrigerant A may alternatively be a natural refrigerant such as water.

As shown in FIGS. 1 and 2, the heat generating component B, such as a diode or transistor, is attached to the lower surface of the bottom wall 22.

As shown in FIG. 1, the inner surface portion of the boiling unit 2 opposed to the heat generating component B, i.e., the upper surface of the bottom wall 22, has fine surface irregularities 24 for promoting boiling and heat transfer. These fine surface irregularities 24 are formed, for example, by brazing an aluminum powder to the upper surface of the bottom wall 22. Alternatively, the fine surface irregularities 24 can be formed by sintering the upper surface of the bottom wall 22, applying a power to the upper surface of the bottom wall 22 by thermal spraying, or etching, knurling, sandblasting or otherwise machining the upper surface of the bottom wall 22. The fine surface irregularities 24 give an increased heat transfer area and promote removal of nucleating bubbles to ensure greatly improved heat dissipating performance.

With reference to FIGS. 1 and 2, the condensing unit 3 comprises an upper and a lower header tank 31 arranged horizontally at a spacing, a plurality of heat exchanger tubes 32 arranged in parallel laterally and each having a lower end joined to the lower header tank 31 and an upper end joined to the upper header tank 31, heat radiating fins 33 fixedly arranged between the adjacent heat exchange tubes 32 and on the outer sides of heat exchange tubes 32 at the left and right ends, and a cooling fan 34 attached to the heat exchange tubes 32 on the rear side thereof. The upper and lower header tanks 31, heat exchange tubes 32 and heat radiating fins 33 are made of a metal material such as aluminum or copper.

The upper and lower header tanks 31 each comprise an extruded tube or electric resistance welded tube having a circular cross section and closed with an end plate at each of opposite end openings thereof.

The heat exchange tubes 32 each comprise a flat extruded tube or electric resistance welded tube having a rectangular or oblong cross section and having upper and lower ends inserted respectively in the upper and lower header tanks 31 and joined thereto as by brazing or welding.

Each heat radiating fin 33 is in the form of a corrugated fin and joined to the outer surface of the heat exchange tube 32 as by brazing or welding. The corrugated fin may be a louver fin or offset fin for use in motor vehicle air conditioners, or a plane fin having a large number of perforations, i.e., a perforated fin, in addition to a usual plane fin. Use of such a fin leads to a still higher heat dissipation effect.

The heat radiating fin 33 positioned at each of the left and right ends is provided on the outer side thereof with a side plate 36 comprising a metal plate, such as an aluminum plate or copper plate, and joined to the fin as by brazing or welding.

The cooling fan 34 to be used is, for example, an axial-flow fan. The cooling fan 34 may be attached directly to the heat exchange tubes 32 on the rear side thereof as shown in FIG. 2(a), or attached to the heat exchange tubes 32 on the rear side thereof by a duct 35 as shown in FIG. 2(b). The cooling fan 34 may be in a suction arrangement wherein the air intake side thereof faces toward the heat exchange tubes 32 (forward) as shown in FIG. 2, or conversely in a forcing-in arrangement wherein the air discharge side of the fan faces toward the heat exchange tubes 32 (forward). Of course, the cooling fan 34 may be attached to the heat exchange tubes 32 at the front side thereof. When operated, the cooling fan 34 causes air C serving as an external fluid to flow between the heat exchange tubes 32 from the front rearward to effect heat exchange with the refrigerant vapor A1 flowing through the heat exchange tube. The external fluid to be subjected to heat exchange with the refrigerant vapor A1 can be selected from among known cooling fluids such as water, besides air C mentioned above. The construction of the condensing unit 3 is suitably modified in accordance with the fluid to be used in this case.

Figure 4:
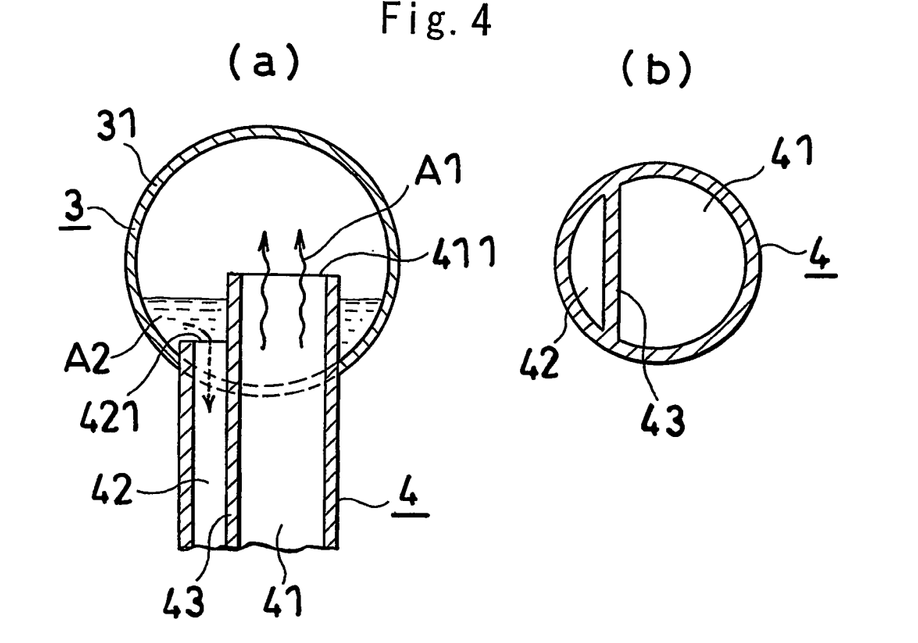
FIG. 4(a) is an enlarged view in vertical section of the upper end portion of the communication pipe and a lower header tank of a condensing unit.
FIG. 4(b) is an enlarged view in horizontal section of the communication pipe.

The communication pipe 4 comprises a pipe internally divided into two channels 41, 42 of different cross sectional areas by a partition wall 43 extending longitudinally of the pipe as shown in FIG. 4. The channel of greater cross sectional area in the pipe serves as the refrigerant vapor channel 41, and the channel of smaller cross sectional area as the refrigerant condensate channel 42. The pipe providing the communication pipe 4 comprises an extruded tube or electric resistance welded tube of aluminum or copper. The communication pipe 4 may be circular in cross section as seen in FIG. 4 or FIG. 3(a) or rectangular or square in cross section as seen in FIG. 3(b).

In order to avoid interference between the refrigerant vapor A1 flowing out of an upper-end outlet 411 of the refrigerant vapor channel 41 into the lower header tank 31 (the bottom portion of the condensing unit 3) and the refrigerant condensate A2 flowing out of the lower header tank 31 into an upper-end inlet 421 of the refrigerant condensate channel 42, the communication pipe 4 has an upper end portion projecting into the lower header tank 31 and partially cut out so that the upper-end outlet 411 of the vapor channel 41 is positioned above the upper-end inlet 421 of the condensate channel 42 as shown in FIG. 4(a). Thus, the upper-end outlet 411 of the vapor channel 41 is positioned at a level higher than the liquid level of the refrigerant condensate A2 in the lower header tank 31, and the upper-end inlet 421 of the condensate channel 42 is positioned at a level lower than the liquid level of the refrigerant condensate A2 in the lower header tank 31. In the lower header tank 31, therefore, the flow of refrigerant vapor A1 acting to rise due to buoyancy is completely separated from the flow of refrigerant condensate A2 acting to flow down under gravity. This ensures smooth circulation of the refrigerant A to obtain a sufficient maximum amount of heat transport.

The length of the communication pipe 4 can be altered suitably in accordance with the distance between the heat receiving position (i.e., the location where the heat generating component B is installed) within the electronic device and the heat radiating position (i.e., in the vicinity of the location where a vent is provided). Further in the case of the ebullition cooling device of FIG. 1, the upper end of the communication pipe 4 is joined to the lengthwise midportion of the lower header tank 31 of the condensing unit 3, and the lower end of the communication pipe 4 is jointed to the center portion of the top wall 23 of the boiling unit 2, whereas when there is a need to dispose other component, device or the like in a portion of the interior space of the electronic device between the boiling unit 2 and the condensing unit 3, the communication pipe 4 may be shifted so as to avoid interference with the component.

A description will now be given of the principle of operation of the ebullition cooling device 1 described. When a large quantity of heat is generated by the component B during the operation of the electronic device, the heat is transferred to the boiling unit 2 to boil the refrigerant A within this unit 2. At this time, upper surface of the bottom wall 22, i.e., the fine surface irregularities 24 provided on the boiling heat transfer surface, promote boiling and heat transfer, assuring efficient heat transfer from the heat generating component B to the refrigerant A. The refrigerant vapor A1 released from the boiling refrigerant A ascends the vapor channel 41 of the communication pipe 4 from the boiling unit 2, flows out of the upper-end outlet 411 of the channel 41 into the lower header tank 31 of the condensing unit 3, from which the vapor dividedly flows upward through the heat exchange tubes 32. While flowing through the tubes 32, the refrigerant vapor A1 is subjected, through the tubes 32 and fins 33, to heat exchange with the air C caused to flow between the heat exchange tubes 32 from the front rearward by the cooling fan 34 and condenses on the inner surfaces of the tubes 32. The refrigerant vapor A1 failing to undergo condensation within the tubes 32 flows into the upper header tank 31 and thereafter flows into some of the tubes 32 again for condensation. The refrigerant condensate A2 produced within the tubes 32 flows down the tubes 32 under gravity and then flows into the lower header tank 31, in which the condensate stays temporarily and then flows into the condensate channel 42 of the communication pipe 4 from the upper-end inlet 421. Since the outlet 411 of the vapor channel 41 is positioned above this inlet 421 of the condensate channel 42, the low of the condensate A2 is completely separated from the flow of refrigerant vapor A1. This ensures smooth circulation of the refrigerant A. The condensate A2 is returned via the condensate channel 42 to the boiling unit 2, where the liquid is boiled again. The refrigerant A repeatedly undergoes the phase changes described above, whereby the heat generating component B is continuously cooled.

Figure 5:
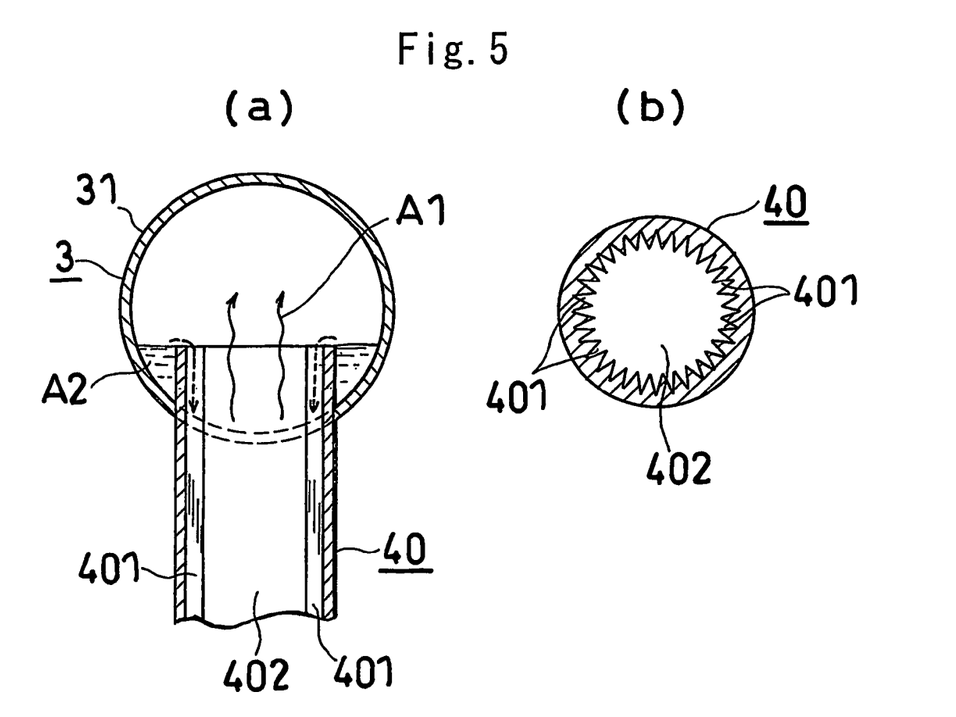
FIG. 5 shows a second embodiment of the invention, (a) being an enlarged view in vertical section of the upper end portion of a communication pipe and a lower header tank of a condensing unit, (b) being an enlarged view in horizontal section of the communication pipe.

FIG. 5 shows a second embodiment of the invention. The ebullition cooling device according to this embodiment for use with a heat generating component comprises a boiling unit 2, a condensing unit 3, and a communication pipe 40 interconnecting the boiling unit 2 and the condensing unit 3. The communication pipe 40 comprises a pipe provided in the inner peripheral surface thereof with a plurality of grooves 401 extending longitudinally of the pipe and so sized as to permit a refrigerant condensate A2 to flow down the grooves under the action of surface tension. The communication pipe 40 permits a refrigerant vapor A1 to flow through an inside portion 402 thereof inwardly of the grooves 401. The interior of the pipe 40 has a cross sectional area smaller than the horizontal cross sectional area of the interior of the boiling unit 2. The pipe providing the communication pipe 40 is in the form of an extruded tube or electric resistance welded tube of aluminum or copper. The pipe 40 has an upper end portion projecting into a lower header tank 31 so that an upper-end opening of the pipe 40 will be positioned at the same level as, or at a level slightly lower than, the liquid level of the refrigerant condensate A2 in the lower header tank 31. When the ebullition cooling device has the communication pipe 40 described above, the refrigerant condensate A2 flows down the grooves 401 of the pipe 40 under the action of surface tension, while the refrigerant vapor A1 flows through the inside portion 402 of the pipe 40 inwardly of the grooves 401, i.e., through the pipe central portion 402 of large cross sectional area and reduced flow resistance. This assures smooth circulation of the refrigerant to effectively obviate the flooding phenomenon. The second embodiment is otherwise substantially the same as the first.

In Example 1, an ebullition cooling device was fabricated which had the same construction as shown in FIGS. 1 to 4. The boiling unit was made from aluminum, and fine surface irregularities were formed on the upper surface of its bottom wall for promoting boiling and heat transfer, by brazing an aluminum powder to the surface. The upper and lower header tanks, heat exchange tubes and heat radiating fins of the condensing unit 3 were also made from aluminum. Used as the communication pipe was an extruded tube of aluminum having a partition wall in its interior and a circular cross section. A fluorocarbon was used as the refrigerant to be enclosed in the device.

Fabricated in Example 2 was an ebullition cooling device having the same construction as the device of Example 1 except that the bottom wall of the boiling unit had a flat upper surface having no fine surface irregularities for promoting boiling and heat transfer.

Further fabricated in Comparative Example was an ebullition cooling device having the same construction as the device of Example 1 except that the communication pipe used was an extruded aluminum tube having a circular cross section and having no partition wall in its interior.

Figure 6:
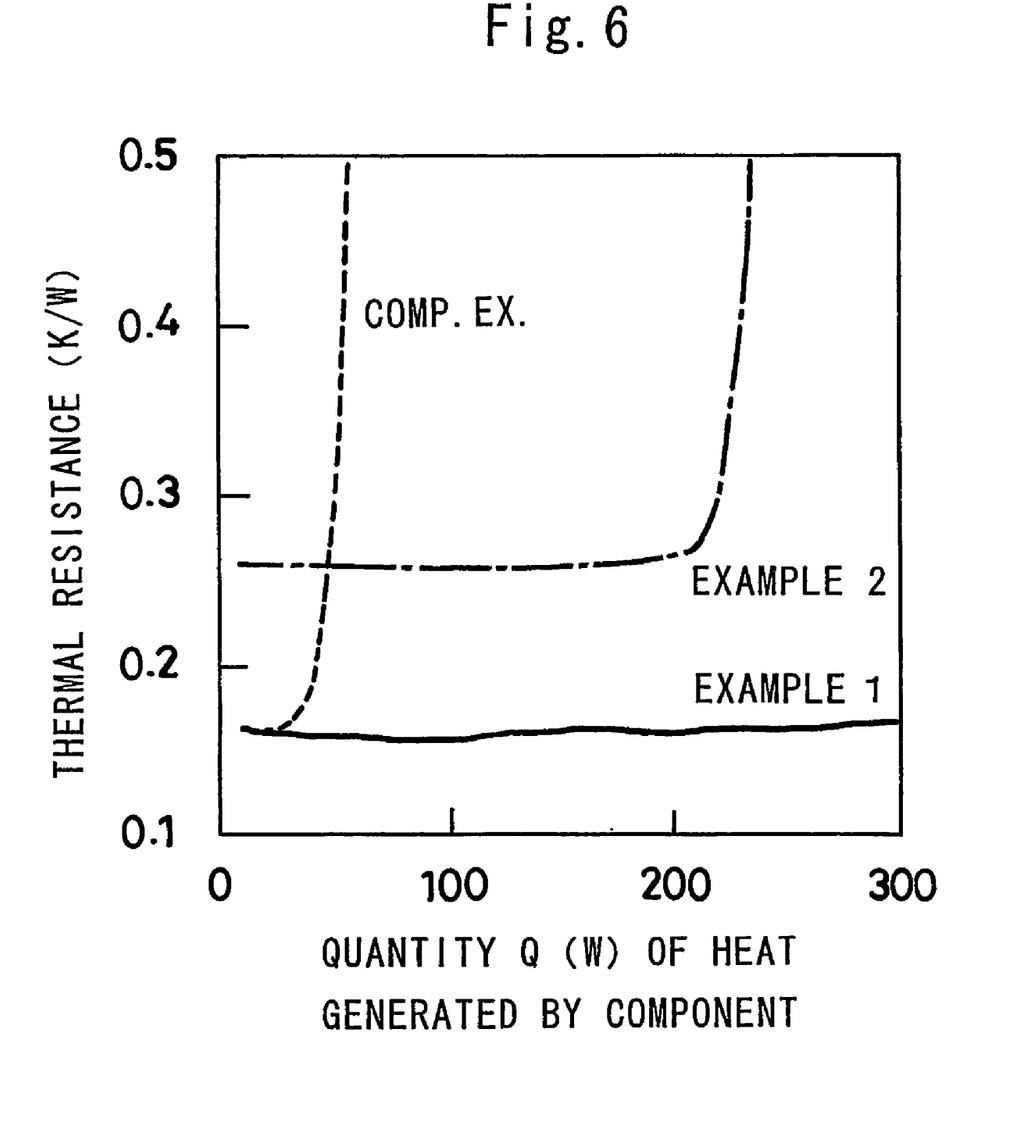
FIG. 6 is a graph showing the relationships between the quantity of heat generated by a component and the thermal resistance, as established in Examples 1, 2 and Comparative Example.

An electric heater serving as a substitute for a heat generating component was attached to the lower surface of boiling unit bottom wall of each cooling device to measure the thermal resistance R (K/W) of the cooling device at varying quantities of heat generation Q (W) of the heater. FIG. 6 shows the results of measurement. FIG. 6 indicates that Example 1 achieved very high cooling performance in terms of thermal resistance of 0.15 K/W at a heat generation quantity of 300 W. Example 2 resulted in a thermal resistance of 0.26 K/W at a heat generation quantity of 200 W, whereas a markedly increased thermal resistance was measured with a further increase in heat generation quantity. A flooding phenomenon occurred within the communication pipe of the device of Comparative Example, so that a markedly increased thermal resistance was measured at a heat generation quantity of about 30 W. The device therefore failed to produce a satisfactory cooling effect.

The invention claimed is:

1. An ebullition cooling device for a heat generating component, comprising:
   a boiling unit configured to boil a refrigerant contained therein with a heat generated by the heat generating component attached to an outer surface of the boiling unit;
   a condensing unit disposed above the boiling unit and configured to condense a refrigerant vapor flowing thereinto from the boiling unit by heat exchange with an external fluid; and
   a communication pipe interconnecting the boiling unit and the condensing unit and having a refrigerant vapor channel and a refrigerant condensate channel therein, the communication pipe having an upper end portion projecting into a bottom portion of the condensing unit, the upper end portion having a partially cutout portion so that an upper-end outlet of the refrigerant vapor channel is positioned above an upper-end inlet of the refrigerant condensate channel so as to avoid interference between a refrigerant vapor flowing out of the upper-end outlet of the refrigerant vapor channel into the bottom portion of the condensing unit and a refrigerant condensate flowing out of the bottom portion of the condensing unit into the upper-end inlet of the refrigerant condensate channel.

2. A heat generating component ebullition cooling device according to claim 1 wherein the communication pipe comprises a pipe internally divided into two channels of different cross sectional areas by a partition wall extending longitudinally of the pipe, the channel of greater cross sectional area in the pipe serving as the refrigerant vapor channel, the channel of smaller cross sectional area in the pipe serving as the refrigerant condensate channel.

3. A heat generating component ebullition cooling device according to claim 1 wherein the boiling unit is provided on an inner surface portion thereof opposed to the heat generating component with fine surface irregularities for promoting boiling and heat transfer.

4. A heat generating component ebullition cooling device according to claim 3 wherein the fine surface irregularities are formed by applying a powder to the inner surface portion of the boiling unit opposed to the heat generating component by brazing or thermal spraying, or by sintering or machining the inner surface portion.

5. A heat generating component ebullition cooling device according to claim 1 wherein the heat generating component is attached to a lower surface of a bottom portion of the boiling unit.

6. A heat generating component ebullition cooling device according to claim 1 wherein the boiling unit comprises a peripheral wall of circular or rectangular or square cross section, a bottom wall closing a lower-end opening of the peripheral wall and a top wall closing an upper-end opening of the peripheral wall.

7. A heat generating component ebullition cooling device according to claim 1 wherein the condensing unit comprises an upper and a lower header tank arranged horizontally at a spacing, a plurality of heat exchanger tubes arranged in parallel laterally and each having a lower end joined to the lower header tank and an upper end joined to the upper header tank, and heat radiating fins fixedly arranged between the adjacent heat exchange tubes and on the outer sides of heat exchange tubes at left and right ends.

8. A heat generating component ebullition cooling device according to claim 7 wherein the condensing unit further comprises a cooling fan attached to one of front and rear sides of the heat exchange tubes directly or by a duct.

9. A heat generating component ebullition cooling device according to claim 1 wherein the condensing unit comprises a header tank disposed horizontally, a plurality of heat exchanger tubes arranged in parallel laterally and each having a lower end joined to the header tank and a closed upper end, and heat radiating fins fixedly arranged between the adjacent heat exchange tubes and on the outer sides of heat exchange tubes at left and right ends.

10. A heat generating component ebullition cooling device according to claim 1 wherein the refrigerant vapor channel and the refrigerant condensate channel of the communication pipe are positioned at a center portion of a top wall of the boiling unit.

11. A heat generating component ebullition cooling device according to claim 1 wherein a sum of a cross sectional area of the refrigerant vapor channel and a cross sectional area of the refrigerant condensate channel is smaller than a cross sectional area of an interior of the boiling unit.

12. An ebullition cooling device comprising:
a boiling unit configured to boil a refrigerant contained in the boiling unit with a heat generated by a heat generating component attached to an outer surface of the boiling unit;
a condensing unit disposed above the boiling unit and configured to condense a refrigerant vapor flowing in the condensing unit from the boiling unit by heat exchange with an external fluid; and
a communication pipe interconnecting the boiling unit and the condensing unit, the communication pipe being joined to a center portion of a top wall of the boiling unit, the communication pipe being internally divided into a refrigerant vapor channel and a refrigerant condensate channel, the communication pipe including an upper end portion projecting into a bottom portion of the condensing unit, the upper end portion having an upper-end outlet of the refrigerant vapor channel and an upper-end inlet of the refrigerant condensate channel, the upper-end outlet of the refrigerant vapor channel being positioned above the upper-end inlet of the refrigerant condensate channel.

* * * * *